United States Patent
Craciun

(10) Patent No.: US 12,073,279 B2
(45) Date of Patent: Aug. 27, 2024

(54) ACCESS SYSTEM

(71) Applicant: Continental Automotive Technologies GmbH, Hannover (DE)

(72) Inventor: Serban Craciun, Timisoara (RO)

(73) Assignee: Continental Automotive Technologies GmbH, Hannover (DE)

( * ) Notice: Subject to any disclaimer, the term of this patent is extended or adjusted under 35 U.S.C. 154(b) by 44 days.

(21) Appl. No.: 18/018,969

(22) PCT Filed: Jul. 16, 2021

(86) PCT No.: PCT/EP2021/070013
§ 371 (c)(1),
(2) Date: Jan. 31, 2023

(87) PCT Pub. No.: WO2022/023083
PCT Pub. Date: Feb. 3, 2022

(65) Prior Publication Data
US 2023/0316013 A1  Oct. 5, 2023

(30) Foreign Application Priority Data

Jul. 31, 2020 (EP) ..................................... 20465549

(51) Int. Cl.
*G06K 7/10* (2006.01)
*G07C 9/00* (2020.01)

(52) U.S. Cl.
CPC ..... *G06K 7/10128* (2013.01); *G07C 9/00309* (2013.01); *G07C 2009/00769* (2013.01); *G07C 2209/64* (2013.01)

(58) Field of Classification Search
CPC ........... G06K 7/10128; G06K 7/10118; G07C 9/00309; G07C 2009/00769;
(Continued)

(56) References Cited

U.S. PATENT DOCUMENTS

2016/0026276 A1 * 1/2016 Lu .................... G06F 3/04162
 345/173
2017/0282858 A1 * 10/2017 Sass .................... H01Q 1/3283

FOREIGN PATENT DOCUMENTS

DE   102013102701 A1   9/2014
DE   102018122254 B3   12/2019
(Continued)

OTHER PUBLICATIONS

Examination Report dated Feb. 23, 2024 from corresponding European patent application No. 21742153.6.
(Continued)

*Primary Examiner* — Joseph H Feild
*Assistant Examiner* — Sharmin Akhter

(57) ABSTRACT

A system comprises a near-field communication controller, a near-field communication antenna electrically coupled to the near-field communication controller, and a near-field communication front end circuit coupled between the near-field communication antenna and the near-field communication controller, wherein the near-field communication front end circuit comprises a sensing capacitor configured to function as a serial capacitance in a matching circuit of the near-field communication front end circuit, the sensing capacitor is further configured to additionally function as a capacitive proximity sensor, and the near filed communication controller is configured to function as a near-field communication controller and to additionally perform capacitive sensing functionalities.

20 Claims, 4 Drawing Sheets

Figure 1:
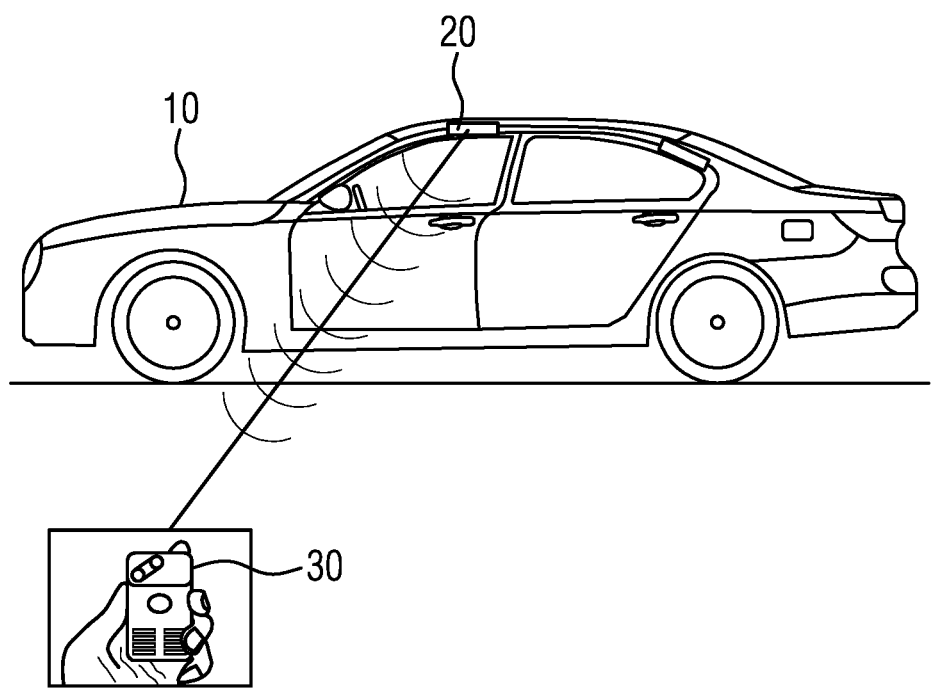

(58) Field of Classification Search
CPC .... G07C 2209/64; H03K 17/955; H04B 5/24; H04B 5/72
See application file for complete search history.

(56) References Cited

FOREIGN PATENT DOCUMENTS

| | | |
|---|---|---|
| EP | 1795860 A1 | 6/2007 |
| EP | 3484059 A2 | 5/2019 |
| WO | 2014146949 A1 | 9/2014 |

OTHER PUBLICATIONS

Search Report dated Jan. 15, 2021 from corresponding European patent application No. 20465549.2.
International Search Report and Written Opinion dated Oct. 22, 2021 from corresponding International patent application No. PCT/EP2021/070013.

* cited by examiner

ACCESS SYSTEM

The current invention relates to an access system, in particular an access system for a vehicle.

Today, most vehicles can be unlocked and remotely started using an electronic vehicle key. In some well-known "start and stop" access systems the user has to press an unlocking button on the electronic remote key to unlock or lock the vehicle, or open a trunk of the vehicle, for example. Such an electronic vehicle key usually has to be inserted into an immobilizer station located inside the vehicle which recognizes the vehicle key and allows the user to start the vehicle. Such systems are continuously replacing previously used ignition switch systems. Other "start and stop" access systems exist that do not require the user to press a button or to insert the key in an immobilizer in order to unlock or lock the vehicle or to start the engine. These "start and stop" access systems are also called a passive start and entry systems. With passive start and entry systems, the vehicle can be unlocked automatically when the key is detected within a certain range of the vehicle. In order to start the vehicle, a start button within the vehicle usually has to be pressed.

When a hand of a user comes close to a door handle of the vehicle, this approaching hand can be detected by means of a proximity sensor (e.g., an optic or a capacitive proximity sensor). The system can then wake up from a standby-mode and start a so-called PASE communication. During a PASE communication, the vehicle can send an encrypted request which can be received by a transponder unit (vehicle key) when the transponder unit is within the required range. The transponder unit can decrypt the request signal and send out an encrypted response signal. The signals can be encrypted according to a certain coding chart which is known to both the vehicle and the transponder unit. The vehicle can compare its original request signal with the received response signal. Based on this comparison, the vehicle can determine whether the transponder unit belongs to the vehicle. If the transponder unit is determined to belong to the vehicle, the door will be allowed to open when the user pulls the door handle. Otherwise, the vehicle will remain locked.

Keyless start and entry systems may additionally or alternatively also use near-field communication (NFC). In such systems a control unit arranged within the vehicle either regularly changes to a polling mode or when a triggering event occurs. In the polling mode, the control unit searches for other NFC devices. If another NFC device is detected within the range of the control unit, the control unit sends out inquiry signals. If the other NFC device is a transponder unit (vehicle key), it receives the inquiry signals and sends a response signal back to the control unit to identify itself. If the response signal is correct and the transponder unit is identified as the transponder unit belonging to the vehicle, the vehicle is unlocked and/or started.

Implementing the aforementioned functionalities (e.g., proximity sensing, NFC, etc.) in a vehicle access system requires electronic arrangements of increasing complexity that include many different components.

The problem to be solved by the current invention is to provide an alternative start and access system which is less complex and costs less to manufacture.

This problem is solved by an access system according to claim 1. Configurations and further developments of the invention are the subject matter of the dependent claims.

A system includes a near-field communication controller, a near-field communication antenna electrically coupled to the near-field communication controller, and a near-field communication front end circuit coupled between the near-field communication antenna and the near-field communication controller, wherein the near-field communication front end circuit comprises a sensing capacitor configured to function as a serial capacitance in a matching circuit of the near-field communication front end circuit, the sensing capacitor is further configured to additionally function as a capacitive proximity sensor, and the near filed communication controller is configured to function as a near-field communication controller and to additionally perform capacitive sensing functionalities.

Thus, a near-field communication front end circuit that is used in an object or vehicle for communication can additionally function as a capacitive sensor without the need for additional components.

The sensing capacitor may comprise an interleaved sensor pattern.

This can allow easily detecting an object approaching the sensing capacitor while the capacitor is still functioning as a serial capacitance in a matching circuit of the near-field communication front end circuit.

The sensing capacitor may comprise a first electrode and a second electrode that together form a very long parallel plate capacitor, wherein an electric field is generated between the first electrode and the second electrode as well as in the environment surrounding the electrodes.

An object approaching the sensing capacitor and entering the electric field generated by the sensor electrodes influences a capacitance of the sensing capacitor.

The first electrode and the second electrode may be formed as conducting traces on a printed circuit board.

Such a printed circuit board may further carry any additional components needed in the near-field communication front end circuit.

The near-field communication antenna may be formed as conducting traces on the printed circuit board, and the sensor electrodes may be arranged directly above the conducting traces that form the near-field communication antenna.

In this way the sensing capacitor and the near-field communication antenna may be arranged on a printed circuit board in a very space-saving manner.

The sensing capacitor may be coupled in series between the near-field communication controller and the near-field communication antenna, the matching circuit of the near-field communication front end circuit may further comprise a parallel capacitance coupled between a ground potential and a common node between the sensing capacitor and the near-field communication antenna, and the matching circuit of the near-field communication front end circuit may further comprise a Q-factor adjustment resistor coupled between the ground potential and the common node between the sensing capacitor and the near-field communication antenna.

The system may further comprise a switch coupled between the Q-factor adjustment resistor and the common node between the sensing capacitor and the near-field communication antenna.

The switch may be configured to disconnect the Q-factor adjustment resistor during capacitive detection, and to connect the Q-factor adjustment resistor during an NFC functionality of the circuit.

By disconnecting the Q-factor adjustment resistor during capacitive detection the sensitivity of the sensing capacitor may be increased.

Examples will now be explained with reference to the drawings. In the drawings the same reference characters denote like features.

FIG. 1 schematically illustrates the general principle of a keyless start and entry system.

Figure 2:
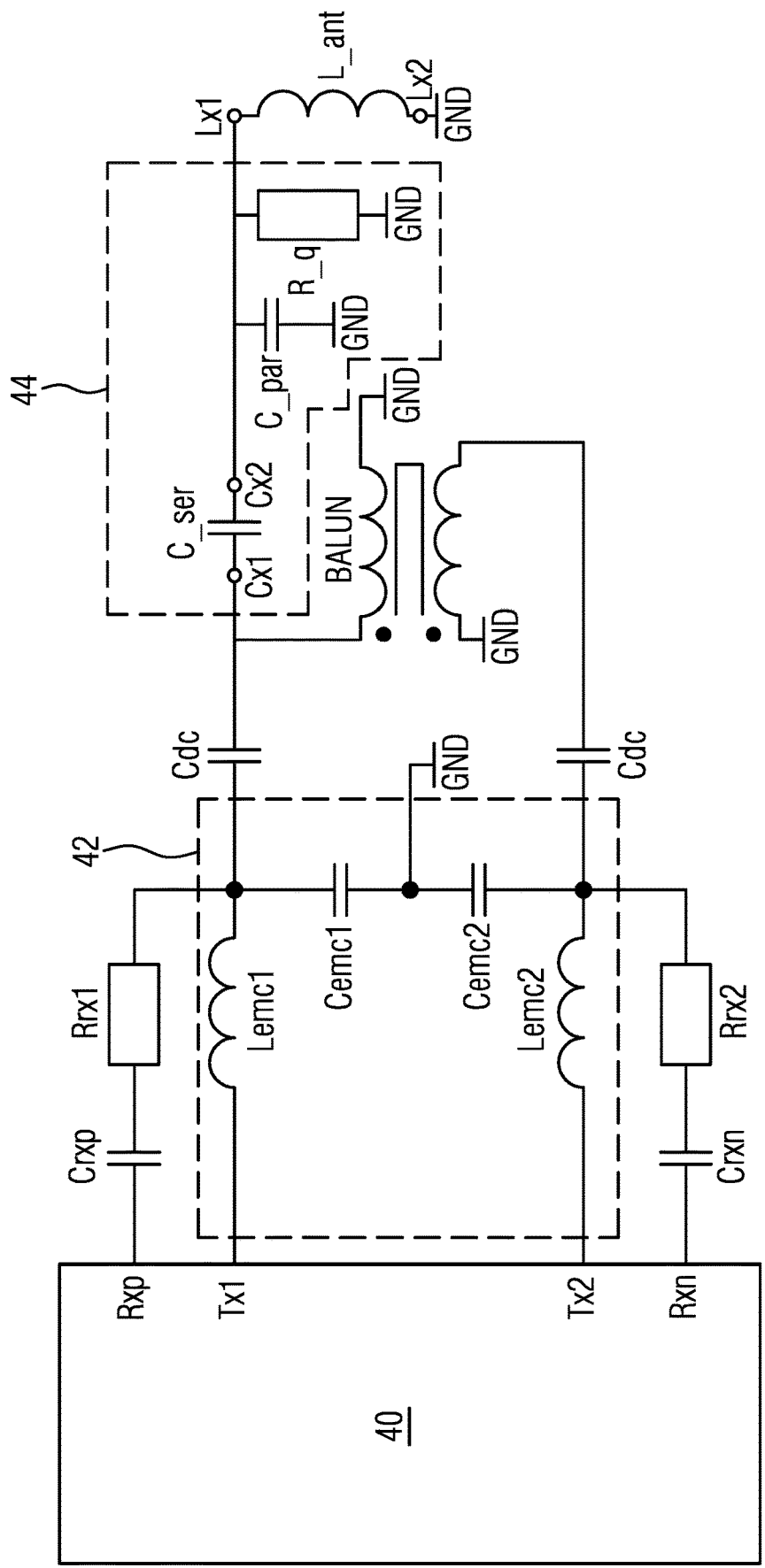

FIG. 2 schematically illustrates in a circuit diagram an NFC front end circuit.

Figure 3:
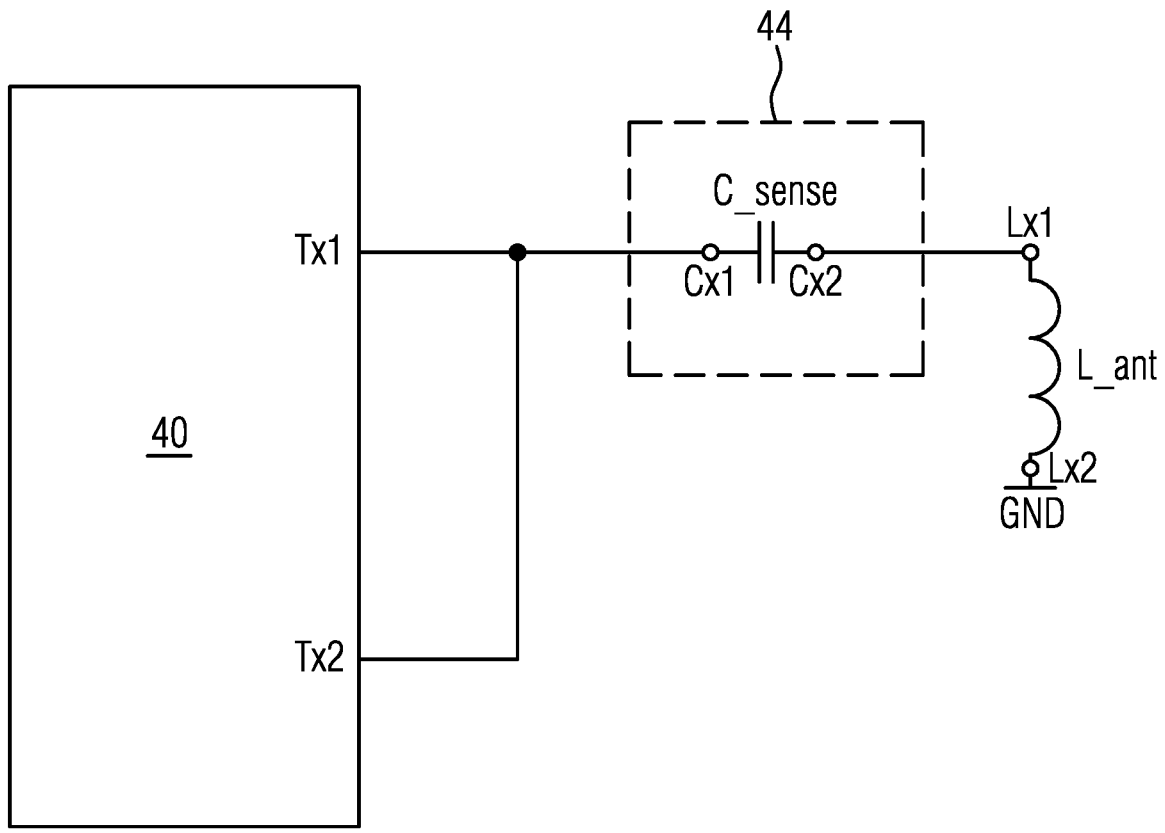

FIG. 3 schematically illustrates in a circuit diagram another NFC front end circuit.

Figure 4:
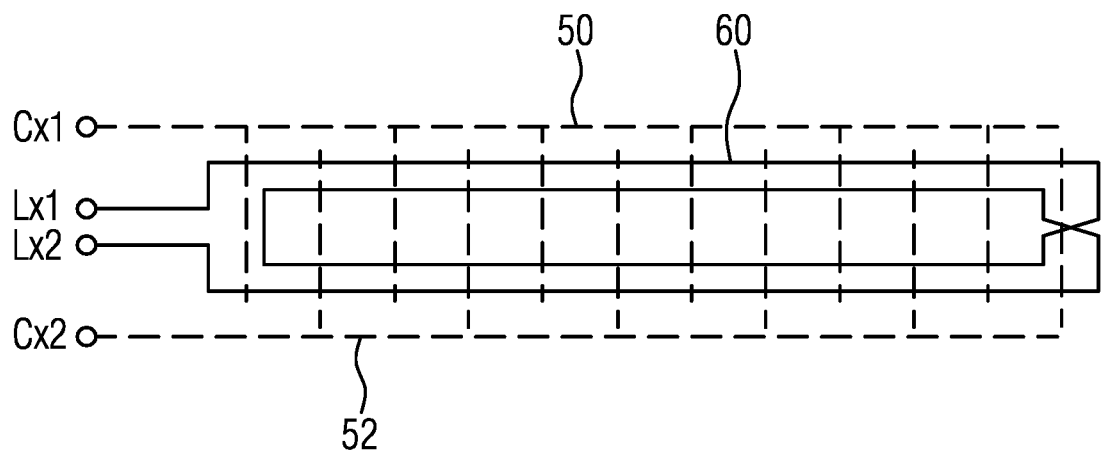

FIG. 4 schematically illustrates an arrangement comprising an antenna and a capacitive sensor.

Figure 5:
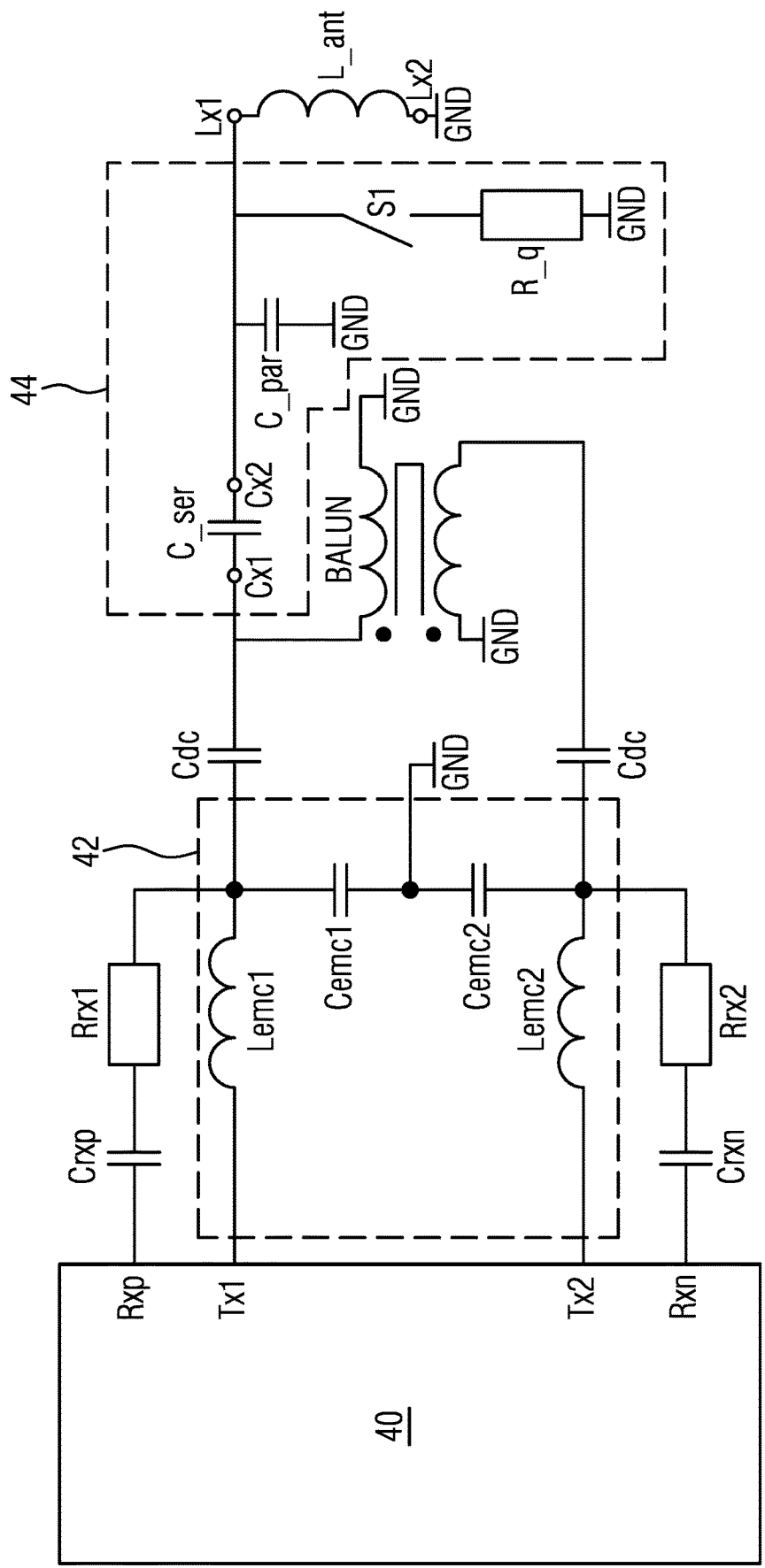

FIG. 5 schematically illustrates in a circuit diagram another NFC front end circuit.

In the figures, only such elements are illustrated that are useful for the understanding of the present invention. For example, the circuit diagrams described below may comprise more than the exemplary elements illustrated in the figures. However, any such elements that are not needed for the implementation of the present invention have been omitted for the sake of clarity.

FIG. 1 illustrates a vehicle 10 with a keyless start and entry system. The start and entry system comprises a control unit 20. The control unit 20 can be arranged anywhere within or on the vehicle 10. The control unit 20 is configured to trigger an unlocking or engine start process if an electronic key belonging to the vehicle 10 is detected near or inside the vehicle 10. The control unit 20 can send out inquiry signals. Such inquiry signals are usually low frequency (about 20 kHz to 200 kHz) signals. The inquiry signals are coded with a first coding chart. The inquiry signals can be received by a transponder unit 30 if the transponder unit 30 is within the range of the signals. The transponder unit 30 decodes, analyses and/or further processes the inquiry signals. After further processing the inquiry signals, the transponder unit 30 sends response signals back to the control unit 20. The response signals are coded with a second coding chart. The response signals can be generated by means of load modulation, for example, and can be decoded in the vehicle 10.

The vehicle 10 knows both coding charts and can compare the original inquiry signals with the received response signals. If the response signals are identified as being correct, the vehicle 10 will be unlocked. If a start button is pressed and the response signals are identified as being correct, the vehicle 10 will be started. If, within a certain period of time after sending the inquiry signals, no response signals or incorrect response signals are received, nothing happens and the vehicle 10 remains locked and/or turned off.

The transponder unit 30 may be arranged within a vehicle key or a portable device such as a mobile phone, for example, which the user of the vehicle 10 carries with him.

The control unit 20 can send out inquiry signals in regular intervals or in response to a certain triggering event. Such a triggering event may be the user touching the door handle or pressing a start button, for example.

Near-field communication (NFC) can be used for start and entry systems for any kind of vehicle (passenger cars, trucks, busses, trains, etc.) as well as for buildings (e.g., private houses, office facilities or public buildings). NFC is a technology that is used to provide short-range wireless connectivity for a two-ways interaction between electronic devices. NFC is promoted and maintained by the NFC Forum, a non-profit industry association created with the goal of advancing the use of NFC technology in consumer electronics, mobile devices and PCs. The NFC Forum promotes the implementation and standardization of NFC technology to ensure interoperability between devices and services. NFC is a flavor of RFID (radio-frequency identification), with an additional, specific set of standards ensuring interoperability of NFC-enabled equipment. NFC standards determine, among other things, the operating environment, data formats, transfer rates, the modulation.

NFC uses inductive coupling between NFC devices, and operates with electromagnetic fields at 13.56 MHz, which is a license-free allocation in the HF portion of the radio spectrum. An NFC device can draw power from the field generated by another NFC device, thus making it independent of a power supply. The NFC device can be implemented in small objects such as tags, stickers, key remote controls or cards.

Nearfield communication defines two types of NFC devices. These are known as initiators and targets. The initiator is the device that initiates the communication. It also controls the data exchange. The target is the device that responds to the request from the initiator and accepts the communication with the initiator to happen.

In known start and entry systems, the control unit 20 in the vehicle 10 is usually the initiator. The control unit 20 searches for other NFC devices in the surroundings of the control unit 20, in particular in the proximity of an antenna within the control unit 20 which generates the electromagnetic field. If another NFC device is detected, the control unit 20 can send out inquiry signals, as has been described above. The detection of another NFC device, therefore, may be the triggering event that triggers the communication between the devices and the authentication of the transponder unit 30. The transponder unit 30 is generally the target device in this case.

NFC recognizes two modes of operation, a passive mode and an active mode, and three modes of communication, a read/write mode, a card emulation mode, and a peer-to-peer mode. In the passive mode of operation, only one NFC device generates an NFC field. In that sense, it is active and always plays the role of the NFC initiator. The passive mode may also be called polling mode. The initiating device may regularly change to a polling mode. In the polling mode the device generates an electromagnetic field and searches for other NFC devices. In the passive mode, the device is always passive and plays the role of the NFC target. The active device (initiator) transfers data by modulating the carrier of the field it generates. The modulation is detected by the passive device and interpreted as data. The passive device transfers data to the active device by load-modulating the intensity of the field. The active device detects the variation of the field and interprets it as data.

The operating distances and data rates generally depend on the size of the antenna of the initiator and the field modulation magnitude. In both directions, the data to be transferred between the devices is encoded with methods defined in ISO/IEC RFID and in the NFC-specific standard. The passive mode is typically used for the contactless reading of tags or smart cards.

In the active mode of operation, both NFC devices generate RF electromagnetic fields. Each side may transmit data using the ASK (amplitude shift keying) modulation scheme. Other modulation schemes are possible, depending on the NFC technology. As compared to the passive mode, larger operating distances of up to 1 m (depending on the protocol) are possible. High data transfer rates called VHBR (very high bit rate) of up to 6.78 Mbit/s are reached when using the PSK (phase shift keying) modulation type. In the active mode, the NFC target generates an active load modulation to answer the initiator request. The radio transmissions are half-duplex as the same radio channel is used for both transmission and reception.

An NFC device that communicates in read/write mode reads data from or writes data to an NFC object. It can then act depending on the information read from the object. For example, an NFC phone in proximity of an NFC tag can retrieve an URL and go to the corresponding website. The read/write mode usually uses the NFC Forum-defined message format. Data transfer in this mode is not secure. In the peer-to-peer (P2P) mode, NFC-enabled devices operate in the active mode. One of the devices initiates a communication link. Once the link is established, the devices alternately talk to one another, applying listen-before-talk rules. The data exchange in this mode of communication is faster than in the other communication modes, so a greater amount of data can be exchanged.

Typical NFC receivers have built-in functionalities such as diagnostic functionalities, for example, which require regular antenna current and/or antenna voltage measurements. Such measurements can be performed with a 16 bit ADC resolution and a low current consumption, for example, and they can be carried out by the initiator during polling mode, for example.

Now referring to FIG. 2, an exemplary NFC front end circuit is schematically illustrated. The NFC front end circuit may comprise an NFC controller 40, and a low pass filter 42 including a first and a second inductance Lemc1, Lemc2 and a first and a second capacitance Cemc1, Cemc2. The first inductance Lemc1 and the first capacitance Cemc1 are coupled in series and between a first port Tx1 of the NFC controller 40 and a ground potential GND. The second inductance Lemc2 and the second capacitance Cemc2 are coupled in series and between a second port Tx2 of the NFC controller 40 and the ground potential GND. The circuit may further comprise a first and a second blocking capacitance Cdc, a differential to single ended converter BALUN, an NFC antenna L_ant, and a matching circuit 44, the matching circuit 44 comprising a serial capacitance C_ser, a parallel capacitance C_par, and a Q-factor adjustment resistor R_q.

A first one of the blocking capacitances Cdc is coupled between the differential to single ended converter BALUN and a common node between the first inductance Lemc1 and the first capacitance Cemc1. A second one of the blocking capacitances Cdc is coupled between the differential to single ended converter BALUN and a common node between the second inductance Lemc2 and the second capacitance Cemc2. The differential to single ended converter BALUN may be coupled to the first blocking capacitance Cdc with a first port and to ground potential GND with a second port. The differential to single ended converter BALUN may further be coupled to the second blocking capacitance Cdc with a third port and to ground potential GND with a fourth port.

The matching circuit 44 is coupled between the NFC antenna L_ant and a common node between the first blocking capacitance Cdc and the differential to single ended converter BALUN. The serial capacitance C_ser of the matching circuit 44 is coupled in series between the NFC antenna L_ant and the common node between the first blocking capacitance Cdc and the differential to single ended converter BALUN. The parallel capacitance C_par and the Q-factor adjustment resistor R_q each are coupled between ground potential GND and a common node between the serial capacitance C_ser and the NFC antenna L_ant.

According to one example, the components of the matching circuit 44 may have the following values for optimal matching: C_ser=20 pF-56 pF, C_par=120 pF-270 pF, and R_q=1 kΩ-10 kΩ. These values, however, are merely examples. Other values may also be suitable depending on the specific application.

As has been described above, the communication between the vehicle 10 and the transponder unit 30 may be started in response to a certain triggering event such as the user touching the door handle, for example. One or more proximity or object detection sensors, therefore, may be arranged in the vehicle 10. Such proximity sensors are often implemented as capacitive sensors. A capacitive proximity sensor may comprise a sensor electrode, for example. This sensor electrode forms a first electrode of a capacitor. An object arranged close to the sensor electrode may form a counter electrode of the capacitor. When an object, e.g., the hand of a user, approaches the sensor electrode, the capacitance of the capacitor formed by the sensor electrode and the counter electrode (object) changes depending on the distance between the sensor electrode and the counter electrode.

The change of the capacitance of the proximity sensor can be determined using direct or indirect techniques. For example, the change of capacitance can be determined by means of the so-called dual-slope technique (by translating the capacitance into a frequency) or the charge/discharge technique (determining the charge and discharge times of the capacitance), for example.

This requires proximity sensors in addition to other circuits and components already present in the vehicle 10.

Now referring to the circuit arrangement illustrated in FIG. 3, the overall number of components is reduced by incorporating the capacitive proximity sensor C_sense in the NFC front end circuit. Only those components that are necessary for understanding the general principles are illustrated in FIG. 3. The capacitive proximity sensor C_sense can replace the serial capacitance C_ser of the NFC front end circuit that has been described with respect to FIG. 2 above. That is, the sensing capacitor C_sense in the arrangement of FIG. 3 can fulfill two different functions. On the one hand, it can function as a serial capacitance in the matching circuit 44 of the NFC front end circuit. On the other hand, it can additionally function as a capacitive proximity sensor.

The sensing capacitor C_sense may comprise an interleaved sensor pattern, for example. An interleaved sensor pattern comprises a first electrode and a second electrode that together form a very long parallel plate capacitor with large amounts of fringing capacitance. An approaching object changes the capacitance of an interleaved capacitive sensor in two different ways. Generally, there is a simple plate capacitance from a first sensor electrode that is coupled to a capacitive sensing circuit to the approaching object's plate. An electric field is generated between the first electrode and the second electrode as well as in the environment adjoining the electrodes. An approaching object also disturbs a portion of fringing capacitance with the electric fields that pass through the environment above the sensor. The object's dielectric (which is higher than that of air) intercepts a portion of this field, thereby increasing the capacitance of the sensor arrangement. This increase in fringing capacitance may be significant if, e.g., a cover material is arranged above the sensor.

One example of an interleaved sensor pattern is schematically illustrated in FIG. 4. The first electrode 50 and the second electrode 52 in this example each comprise a comb-like structure, wherein the tines or teeth of the electrodes 50, 52 interleave. The first electrode 50 and the second electrode 52 may be formed as conducting traces on a printed circuit board, for example. The NFC antenna 60 may also be formed by means of conducting traces on the printed circuit board. As is exemplarily illustrated in FIG. 4, it is possible to arrange the sensor electrodes 50, 52 above the conducting traces that form the NFC antenna 60. The electric field generated by the sensor electrodes 50, 52 generally does not influence the electric field generated by the NFC antenna 60. In this way, a space-saving arrangement can be realized on the printed circuit board. It is, however, also possible, for the sensor electrodes 50, 52 to be arranged on the printed circuit board distant from the NFC antenna 60.

The arrangement described above allows detecting even small changes of capacitance. For example, it is possible to detect changes of between 0.5 pF and 1 pF. Depending on the sensing capacitor C_sense used in the arrangement, changes of capacitance of up to 10 pF or even more can be detected when a user's hand or any other object moves into the electric field generated by the sensor electrodes 50, 52. The capacitance of the sensing capacitor C_sense can be determined by first determining a voltage received on the Rx feedback lines Rxp, Rxn, as illustrated in the examples of FIGS. 2 and 5. The Rx feedback lines each may comprise a capacitance Crxp/Crxn and a resistor Rrx1/Rrx2 coupled in series between a port Rxp/Rxn of the NFC controller 40 and the common node between the first or second inductance Lemc1, Lemc2 and the first or second capacitance Cemc1, Cemc2.

The form and arrangement of the sensor electrodes 50, 52 illustrated in FIG. 4, however, is merely an example. Any other suitable forms and arrangements of interleaved sensor electrodes 50, 52 may also be used.

As is exemplarily illustrated in the circuit diagram of FIG. 5, the sensitivity of the sensing capacitor C_sense can be increased by disconnecting the quality factor adjustment resistor R_q using a switch S1. The switch S1 may be configured to disconnect the resistor R_q (switch S1 open) during capacitive detection, and to connect the resistor R_q (switch S1 closed) during NFC functionality of the circuit.

By means of the exemplary arrangements described above, the NFC functionality, which is usually already present in a vehicle 10, may be combined with a capacitive sensing functionality without the need for additional components. The NFC controller 40 may be configured to function as a conventional NFC controller and additionally perform the required capacitive sensing functions.

The components that are exemplarily illustrated in the figures need not only be arranged in passenger cars. They can alternatively be arranged in any other kind of vehicle such as trucks or busses, for example, as well as in buildings or garages. Generally speaking, the control unit 20 may be arranged within any object that is desired to be unlocked or started using an electronic key.

LIST OF REFERENCE SIGNS

10 vehicle
20 control unit
30 transponder unit
40 NFC controller
42 low pass filter
44 matching circuit
50 first electrode
52 second electrode
60 NFC antenna
Rxp, Rxn Rx feedback lines
Tx1, Tx2 first and second port
Crxp, Crxn capacitances
Rrx1, Rrx2 resistors
Lemc1, Lemc2 inductances
Cemc1, Cemc2 capacitances
Cdc blocking capacitance
C_ser serial capacitance
C_par parallel capacitance
R_q Q-factor adjustment resistor
L_ant NFC antenna
BALUN differential to single ended converter
C_sense proximity sensor
S1 switch

The invention claimed is:

1. A system comprising:
a near-field communication controller;
a near-field communication antenna electrically coupled to the near-field communication controller; and
a near-field communication front end circuit coupled between the near-field communication antenna and the near-field communication controller, wherein
the near-field communication front end circuit comprises a sensing capacitor configured to function as a serial capacitance in a matching circuit of the near-field communication front end circuit,
the sensing capacitor is further configured to additionally function as a capacitive proximity sensor, and
the near-field communication controller is configured to function as a near-field communication controller and to additionally perform capacitive sensing functionalities.

2. The system of claim 1, wherein the sensing capacitor comprises an interleaved sensor pattern.

3. The system of claim 2, wherein the sensing capacitor comprises sensor electrodes: a first electrode and a second electrode that together form a very long parallel plate capacitor, wherein an electric field is generated between the first electrode and the second electrode as well as in an environment surrounding the sensor electrodes.

4. The system of claim 3, wherein an object approaching the sensing capacitor and entering the electric field generated by the sensor electrodes influences a capacitance of the sensing capacitor.

5. The system of claim 4, wherein the first electrode and the second electrode are formed as conducting traces on a printed circuit board.

6. The system of claim 5, wherein the near-field communication antenna is formed as conducting traces on the printed circuit board, and the sensor electrodes are arranged directly above the conducting traces that form the near-field communication antenna.

7. The system of claim 6, wherein
the sensing capacitor is coupled in series between the near-field communication controller and the near-field communication antenna,
the matching circuit of the near-field communication front end circuit further comprises a parallel capacitance coupled between a ground potential and a common node between the sensing capacitor and the near-field communication antenna, and
the matching circuit of the near-field communication front end circuit further comprises a Q-factor adjustment resistor coupled between the ground potential and the common node between the sensing capacitor and the near-field communication antenna.

8. The system of claim 3, wherein the first electrode and the second electrode are formed as conducting traces on a printed circuit board.

9. The system of claim 8, wherein the near-field communication antenna is formed as conducting traces on the printed circuit board, and the sensor electrodes are arranged directly above the conducting traces that form the near-field communication antenna.

10. The system of claim 9, wherein
the sensing capacitor is coupled in series between the near-field communication controller and the near-field communication antenna,
the matching circuit of the near-field communication front end circuit further comprises a parallel capacitance coupled between a ground potential and a common node between the sensing capacitor and the near-field communication antenna, and
the matching circuit of the near-field communication front end circuit further comprises a Q-factor adjustment resistor coupled between the ground potential and the common node between the sensing capacitor and the near-field communication antenna.

11. The system according to claim 10, further comprising a switch coupled between the Q-factor adjustment resistor and the common node between the sensing capacitor and the near-field communication antenna.

12. The system according to claim 11, wherein the switch is configured to disconnect the Q-factor adjustment resistor during capacitive detection, and to connect the Q-factor adjustment resistor during near-field communication functionality.

13. The system of claim 1, wherein
the sensing capacitor is coupled in series between the near-field communication controller and the near-field communication antenna,
the matching circuit of the near-field communication front end circuit further comprises a parallel capacitance coupled between a ground potential and a common node between the sensing capacitor and the near-field communication antenna, and
the matching circuit of the near-field communication front end circuit further comprises a Q-factor adjustment resistor coupled between the ground potential and the common node between the sensing capacitor and the near-field communication antenna.

14. The system according to claim 13, further comprising a switch coupled between the Q-factor adjustment resistor and the common node between the sensing capacitor and the near-field communication antenna.

15. The system according to claim 14, wherein the switch is configured to disconnect the Q-factor adjustment resistor during capacitive detection, and to connect the Q-factor adjustment resistor during near-field communication NFC-functionality.

16. A vehicle comprising a system of claim 1.

17. The vehicle of claim 16, wherein the sensing capacitor comprises an interleaved sensor pattern.

18. The vehicle of claim 17, wherein the sensing capacitor comprises sensor electrodes: a first electrode and a second electrode that together form a very long parallel plate capacitor, wherein an electric field is generated between the first electrode and the second electrode as well as in an environment surrounding the sensor electrodes.

19. The vehicle of claim 18, wherein an object approaching the sensing capacitor and entering the electric field generated by the sensor electrodes influences a capacitance of the sensing capacitor.

20. The vehicle of claim 19, wherein the first electrode and the second electrode are formed as conducting traces on a printed circuit board.

* * * * *